Aug. 8, 1967 J. H. G. ZDZIEBORSKI 3,335,332
TIME DELAY UNIT
Filed Sept. 29, 1964

INVENTOR.
J. H. George Zdzieborski
BY
Blair & Buckles
ATTORNEYS.

United States Patent Office 3,335,332

Patented Aug. 8, 1967

3,335,332
TIME DELAY UNIT

J. H. George Zdzieborski, Stamford, Conn., assignor to Hancock Telecontrol Corporation, Old Greenwich, Conn.

Filed Sept. 29, 1964, Ser. No. 399,992
7 Claims. (Cl. 317—142)

ABSTRACT OF THE DISCLOSURE

The disclosure relates to a time delay circuit including a resistor and a capacitor connected in series across a supply source. First and second parallel circuits respectively include a first junction developing a zero suppression voltage of a value greater than the reference voltage but less than the rated voltage of the supply source and the other a second junction developing a voltage somewhat greater than the zero suppression voltage. A unijunction transistor has its emitter terminal connected to the junction between the resistor and capacitor, its base one terminal connected to the first junction; and its base two terminal connected to the second junction. The unijunction transistor conducts when its emitter voltage rises, as the capacitor charges, to a predetermined percentage of the voltage difference between the zero suppression voltage and the voltage at the second junction.

A wide variety of mechanical and electromechanical time relay devices have been developed in the past. Generally, such time delay devices are found to be quite inaccurate and thus not particularly suited for providing short time delays. They are more suited for providing longer time delays where errors, relatively speaking, become less significant. Such time delay devices are generally incapable of fast recycling so as to provide a rapid succession of uniform time delays. Moreover, they lack repeatability, e.g., the property of consistently providing the same time delay each and every time the device is actuated. Mechanical and electromechanical time delay devices are generally bulky in size and not suited to modular construction. Environmental sensitivity also detracts from the accuracy of these time delay devices.

Recently, electrical time delay devices have gained considerable acceptance since they offer many advantages over mechanical and electromechanical time delay devices. Electrical time delay devices may be made much more compactly and are particularly suited to modular construction. They are generally more reliable, less expensive and more trouble free than their mechanical or electromechanical counterparts. Completely electrically operated time delay devices have considerably improved recycling and repeatability characteristics, and are more accurate, particularly for short time delay periods.

Typically, a capacitor is used to meter the passage of time in electrical circuitry. The charging or discharging rate of a capacitor is a function of time and can be predicted with accuracy. This rate is determined by appropriate selection of the parameters of the circuit components connected in the charging and discharging paths for the capacitor. With a capacitor connected in the input circuit of a suitable threshold voltage detector, for example, the time required for the capacitor to charge from an established minimum voltage to the predetermined threshold voltage necessary to trigger the voltage detector may serve to define a time delay. The duration of this time delay may be readily determined by appropriate selection of the parameters of the capacitor and the other circuit components in the capacitor charging circuit. By simply varying the value of one or more of these components, the duration of the time delay may be correspondingly varied.

In the more obvious circuit embodiments developed to utilize a capacitor as the timing element, there is found to be a definite limitation on the maximum obtainable time delay duration. To provide a long time delay, the magnitude of the capacitor charging current must be maintained quite low. This is because the voltage across the capacitor at any instance in time is proporitional to the charge on the capacitor which, in turn, is proportional to the current magnitude multiplied by the elapsed charging time. Thus to increase the time required for a capacitor to charge to a predetermined threshold voltage, the magnitude of the charging current must be decreased. There is however, a limitation on the minimum magnitude of charging current. If the magnitude of charging current is too low, the leakage of charge off the capacitor will become a significant factor which may even prevent the capacitor from charging to the threshold voltage.

A second limitation resides in the inaccuracies of the voltage detector which responds when the voltage developed across the timing capacitor reaches the threshold level. As is well known, the charging curve for a capacitor is an exponential function having a very steep initial slope which decreases to essentially zero slope as the voltage across the capacitor approaches the voltage of the charging source. Consequently, as the slope of the charging curve decreases, each increasing increment of voltage corresponds to progressively larger increments of time. Accordingly, if the established threshold voltage falls on the relatively flat portion of the charging curve, which it must if long time delays are desired, the accuracy of the voltage detector becomes a significant limitation. It will be seen that any significant deviation in the established threshold voltage on this portion of the charging curve gives rise to a considerable deviation in time.

Since to provide long time delays, the threshold voltage must be established at a relatively high level, a limitation is placed on the types of threshold voltage detectors that can be employed. A threshold voltage above 20 volts virtually eliminates all conventional semiconductor devices. Although high-voltage semiconductor devices are available, they are of the exotic type and thus quite expensive. Thus, the well-known manifold advantages of semiconductor devices have not been utilized where relatively long time delays have been desired.

It is accordingly an object of the present invention to provide an electrical time delay unit adapted to indicate the expiration of a predetermined time period.

An additional object is to provide a time delay unit of the above character which is capable of operating with substantially improved accuracy.

A further object of the invention is to provide a time delay unit of the above character which is capable of providing both long and short time delays.

A still further object of the present invention is to provide a time delay unit of the above character capable of employing low-voltage semiconductor devices.

A yet further object is to provide a time delay unit of the above character having improved repeatability, rapid recycling time, and compact size, and which is simplified in design and inexpensive to manufacture.

Other objects of the invention will in part be obvious and will in part appear hereinafter.

The invention accordingly comprises the features of construction, combinations of elements, and arrangement of parts which will be exemplified in the constructions hereinafter set forth, and the scope of the invention will be indicated in the claims.

For a fuller understanding of the nature and objects of the invention, reference should be had to the following detailed description taken in connection with the accompanying drawings in which.

Corresponding parts in the several views of the drawings are given similar reference designations.

Figure 1:
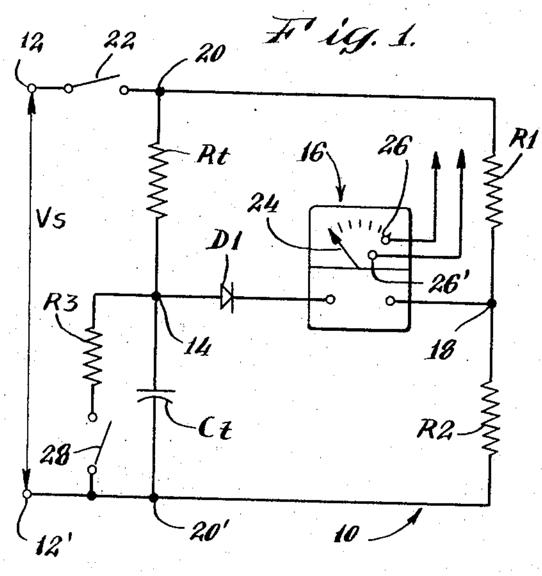
FIGURE 1 is a schematic circuit diagram of an embodiment of my invention.

Referring generally to the drawings and particularly to FIGURE 1, a time delay unit, generally indicated at 10, comprises a resistor $R_t$ and capacitor $C_t$ connected in series across input terminals 12, 12′ which, in turn, are connected to a source $V_s$. Series connected resistors R1 and R2 are also connected across the input terminals 12, 12′. The junction between resistor $R_t$ and capacitor $C_t$, indicated at 14, is connected through a diode D1 to one terminal of a voltage detector, generally indicated at 16. The junction between resistors R1 and R2, indicated at 18, is connected to the other input terminal of the voltage detector 16.

At this point it should be noted that the components $R_t$, $C_t$, R1 and R2 make up the four arms of a bridge network. Junction 20 at the upper terminal of resistor $R_t$ constitutes one bridge input terminal while junction 20′ at the lower terminal of capacitor $C_t$ comprises the other bridge input terminal. Junctions 14 and 18 then become the output terminals of this bridge network. By virtue of the diode D1, the voltage detector 16 responds only when the voltage at junction 14 is positive relative to the voltage at junction 18. Since the voltage detector 16 does not respond to the full voltage at junction 14, but rather to the voltage differential between junctions 14 and 18, the zero voltage reference of the detector 16 is in effect suppressed by an amount equal to the magnitude of the voltage at junction 18.

This zero reference suppression feature will become more apparent on consideration of the operation of the time delay unit 10 of FIGURE 1. To initiate a time delay function, a switch 22 connected between terminal 12 and junction 20 is closed to apply the voltage $V_s$ across the bridge input terminals 20, 20′. The timing capacitor $C_t$ begins charging through the resistor $R_t$. A typical voltage versus time charging curve is indicated at 24 in FIGURE 4. Thus, the curve 24 represents the time variation of the voltage appearing at junction 14. The voltage at junction 18 immediately assumes a value determined by the voltage dividing action of resistors R1 and R2. Thus during the initial period of the time delay, junction 18 is considerably more positive than junction 14 and current flow through the detector 16 is blocked by the diode D1. As the timing capacitor $C_t$ continues to charge, the voltage at junction 14 increases and eventually reaches the same level as the voltage at junction 18. Further increase in the voltage at junction 14 forward biases the diode D1 enabling the detector 16 to respond to the voltage differential between junctions 14 and 18. It will thus be noted that the detector 16 may be a relatively low voltage device since it is called upon to sense only the voltage difference between junctions 14 and 18, and not the full voltage developed across the timing capacitor $C_t$.

To provide a ready appreciation of the important features and advantages of my invention, it will be assumed that the voltage detector 16 is a voltmeter, such as of the permanent magnet moving coil (PMMC) type. It should be understood that this is not the preferred form of voltage detector to be used in my invention. Since the voltage detector 16 is only concerned with the voltage difference between junctions 14 and 18, the voltmeter may be of very low scale, such as, for example, one volt full scale. Thus, when the voltmeter pointer 24 registers one volt, it will be in a position to bridge a pair of contacts 26, 26′ connected in a control circuit. Accordingly, with the switch 22 closed to begin a time delay, the contacts 26, 26′ are bridged by the pointer 24 to energize a relay, for example, signalling the expiration of the time delay when the voltage at junction 14 exceeds the voltage at junction 18 by one volt. It will be assumed that the voltage drop across the forward biased diode D1 is negligible.

If the full scale accuracy of the voltmeter 16 is ±5%, for example, then the contacts 26, 26′ may be bridged by the pointer 24 when the voltage across the voltmeter is in the range from 0.95 volt to 1.05 volts. Assume for the purpose of illustration, that the resistors R1 and R2 are proportioned in value so that with 100 volts across the input terminals 12, 12′, the junction 18 is at 80 volts. Thus, when considering the amount of zero suppression provided by the voltage at junction 18, indicated at 25 in FIGURE 4, the contacts 26, 26′ are actually bridged when the voltage at junction 14 is between 80.95 volts and 81.05 volts. Even at the relatively flat portion of the charging curve 24 or FIGURE 4, such as at point 27, a 0.1 volt deviation about a nominal value of 80 volts does not provide a significant variation in the duration of the time delay.

If, however, the voltage detector 16 was operated in the conventional manner, where it would respond to the full voltage developed across the capacitor $C_t$, an inaccuracy of ±5% of a full scale reading of in excess of 80 volts would amount to a relatively substantialy possible voltage deviation. At ±5%, bridging of the contacts 26, 26′ might occur between 76 and 84 volts. This 8 volt spread about point 27 on the charging curve 24 of FIGURE 4 will result in an intolerable deviation in the time delay period.

By virtue of the bridge arrangement of FIGURE 1, the time delay unit 10 is relatively insensitive to gradual voltage variations or drifts in the source $V_s$. This can be seen from the fact that although the capacitor $C_t$ charges at a slower rate when the magnitude of the source voltage $V_s$ gradually decreases, the voltage at junction 18 also decreases to provide essentially perfect compensation. Accordingly, notwithstanding gradual variations in the magnitude of the source voltage $V_s$, the period of the time delay remains constant.

Once the contacts 26, 26′ are bridged to signal the expiration of the time period, the switch 22 is opened to remove the charging source $V_s$ from the time delay unit 10. Since the capacitor $C_t$ must be charged from a zero voltage, a switch 28 connected across this capacitor is closed to discharge it. A resistor R3 connected in this discharge path limits the discharging current so as to preserve the contacts of the switch 28. Once the capacitor $C_t$ is fully discharged, switch 22 may be again closed to initiate a second time delay.

Figure 4:
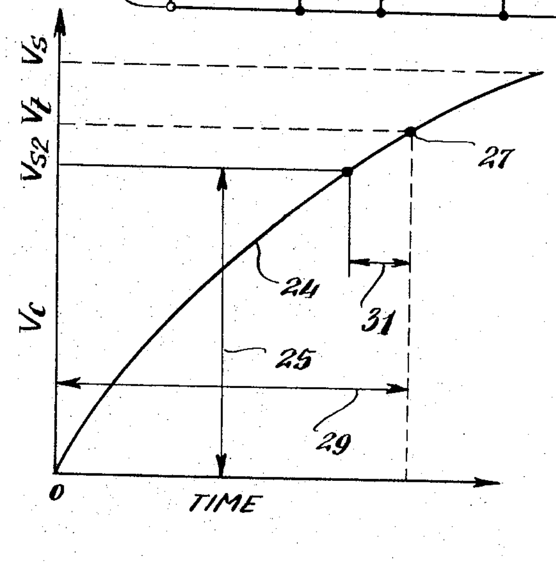
FIGURE 4 is a timing curve graphically illustrating the operation of the embodiments of FIGURES 1, 2 and 3.

Variations in the time delay provided by the unit 10 are readily effected by varying the amount of zero suppression, or by varying the values of the resistor $R_t$ and/or capacitor $C_t$. Moreover, the zero suppression feature provides for a considerably longer time delay than is otherwise possible when using a low voltage detector. Referring to FIGURE 4, reference numeral 29 indicates the duration of the time delay with zero suppression while reference numeral 31 indicates the approximate time delay obtained without zero suppression.

Figure 2:
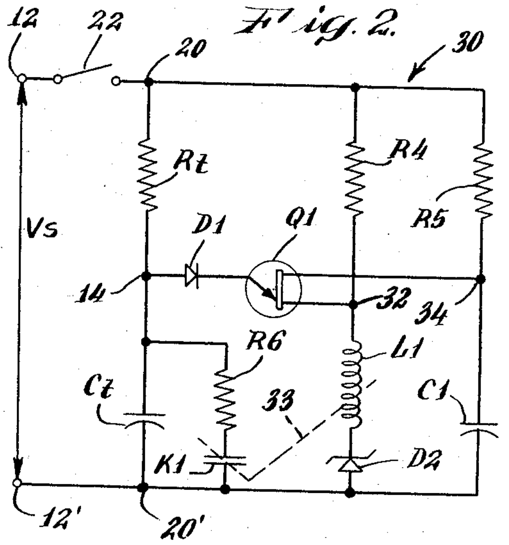
FIGURE 2 is a detailed circuit schematic diagram of another embodiment of my invention.

Turning to FIGURE 2, in a more preferred embodiment of my invention, a unijunction transistor Q1 is substituted for the voltmeter of FIGURE 1. The basic principles of my invention described in connection with FIGURE 1 are also embodied in a time delay unit generally indicated at 30 in FIGURE 2. In similar fashion the resistor $R_t$ and the timing capacitor $C_t$ are connected in series across the input terminals 12, 12′. The charging source $V_s$ is applied across these input terminals. The junction 14 between the resistor $R_t$ and the capacitor $C_t$ is connected through a diode D1 to the emitter of the unijunction transistor Q1. A resistor R4, a relay coil L1 of a relay, generally indicated at 33, and a Zener diode D2 are connected in series across the input terminals 12, 12′. In addition, the series combination of a resistor R5 and a capacitor C1 is connected across the input terminal 12, 12'. The base one terminal of the unijunction transistor Q1 is connected to a junction 32 between the resistor R4 and the relay coil L1. The base two terminal of unijunction transistor Q1 is connected to the junction 34 between resistor R5 and capacitor C1. Relay contacts K1 of the relay 33, operate on energization of the relay coil L1 to complete a discharge circuit for capacitor $C_t$. A resistor R6 connected in this discharge circuit limits the discharging current so as to preserve the relay contacts K1. As in FIGURE 1, the bridge network is obtained with junctions 20, 20' as input terminals and junctions 14 and 32 as output terminals.

The operation of the time delay unit 30 of FIGURE 2 is basically similar to the operation of unit 10 of FIGURE 1. With the capacitor $C_t$ completely discharged, switch 22 is closed to apply the charging source $V_s$ across the input terminals 12, 12'. The voltage at junction 32 will assume a level determined by the values of resistor R4 and the DC resistance of the relay coil L1, and the particular voltage rating of the Zener diode D2. The capacitor C1 charges up rapidly in comparison to the charging rate of the capacitor $C_t$ so as to bring the voltage at junction 34 to the level of the source $V_s$. It will thus be seen that the voltage between the base one and base two terminals of the unijunction transistor Q1 is the voltage differential between junctions 32 and 34. A unijunction transistor has the property whereby the emitter-base one junction breaks down to become effectively a short circuit when the voltage on its emitter terminal is raised to a value which is an established percentage of the voltage across its base terminals. A typical value of emitter break down voltage is 70% of the voltage across the base terminals. The particular value, termed threshold voltage, is established at a specific level by the manner in which the unijunction transistor is fabricated, but varies somewhat with identically fabricated unijunction transistors. Thus unijunction transistors are rated at a specific threshold voltage which is typically accurate to ±5 to 10%. Moreover, the same unijunction transistor will not break down at exactly the same threshold voltage each and every time.

Again, it will be assumed that the voltage $V_s$ applied across the input terminals 12, 12' is 100 volts. Using a 90-volt Zener diode D2, for example, the voltage at the lower terminal of the relay coil L1 is clamped at 90 volts. Resistor R4 is selected so that the drop across the relay coil L1 is 5 volts thus establishing the voltage level at junction 32 at 95 volts. This 5-volt drop across the relay coil is less than the requisite "pull-in" voltage to close the contacts operatively associated with the relay 33 including contacts K1, but is greater than the "holding" voltage required to sustain the relay in the operated condition once the "pull-in" voltage is exceeded. Thus, during the period of the time delay which is initiated by closure of switch 22, the relay 33 is not operated and its contacts K1 are open. Capacitor $C_t$ begins charging along the curve 24 of FIGURE 4 to increase the voltage at junction 14. During the initial portion of the time delay period, the voltage at junction 14 is low whereas the voltage at junction 34 is equal to the supply voltage, e.g., 100 volts. The capacitor C1 serves as a by-pass capacitor to hold the junction 34 at approximately 100 volts notwithstanding fluctuations in this supply voltage. The diode D1 prevents this relatively high reverse voltage from harming unijunction transistor Q1. Eventually, the voltage at junction 14 will equal the voltage at junction 32. Since the unijunction transistor Q1 does not fire or break down until the voltage on its emitter reaches 70% of the voltage across its base terminals, in this case 5 volts, the necessary firing voltage at the emitter is 98.5±0.35 volt. It will thus be seen that the voltage established at junction 32 corresponds to the zero suppression voltage established at junction 18 in FIGURE 1. As the voltage at junction 14 reaches 98.5 volts, assuming a negligible voltage drop across the diode D1, the unijunction transistor Q1 breaks down to in effect short its emitter and base one terminals together.

At this point, the capacitor $C_t$ discharges through the diode D1, the emitter-base one circuit of unijunction transistor Q1 and the relay coil L1. With this additional current flowing through relay coil L1, the pull in voltage of the relay 33 is exceeded and contacts K1 close. The Zener diode D2 insures that all of this additional voltage is developed across the relay coil L1. Additional contacts (not shown) associated with relay 33 may be used to initiate a control function or energize a signal indicator signifying the expiration of the time delay. The capacitor $C_t$ is then completely discharged through the resistor R6 and the relay contacts K1. It will be appreciated that without this discharge circuit, the capacitor $C_t$ would only discharge down to 95 volts equaling the voltage at junction 32. No more current would then flow through the emitter-base one circuit of the unijunction transistor Q1 and the unijunction transistor would regain its blocking characteristic. Since, as previously stated, with switch 22 closed the normal current through the relay coil L1 is sufficient to hold the relay 33 operated. The contacts K1 thus remain closed to insure complete discharge of the timing capacitor $C_t$. The switch 22 is then opened to drop out the relay 33 and the time delay unit 30 is in ready for another time delay.

Although not preferred, the discharge path of resistor R6 and contacts K1 may be omitted. The capacitor $C_t$ may be discharged substantially completely through the emitter-base one circuit of the unijunction transistor Q1 by opening switch 22 to drop the voltages at junctions 32 and 34. There is the possibility that excessive currents through the unijunction transistor Q1 will cause it harm and also, the capacitor $C_t$ may not completely discharge before the emitter-base one junction regains its blocking characteristics.

It will thus be seen that, notwithstanding the low voltage limitations, the unijunction transistor Q1 is utilized as a voltage detector in the delay unit 30. Again, notwithstanding its low voltage limitations, the unijunction transistor Q1 may be used in the delay circuit 30 for providing a long time delay period. This is accomplished by the unique zero suppression feature of the invention. From FIGURE 4 it will be seen that with this zero suppression feature, a long time delay, indicated at 29, is provided. Without zero suppression, however, the maximum time delay obtainable is roughly indicated by 31.

It will be readily noted from FIGURES 2 and 4 that the duration of the time delay may be readily varied by an adjustment of the values of resistor $R_t$ and/or capacitor $C_t$, or alternatively, by appropriately varying the amount of zero suppression. This alternative adjustment is rather limited because of the presence of the by-pass capacitor C1.

The advantage of increased accuracy discussed in connection with the embodiment of FIGURE 1 is also present in the embodiment of FIGURE 2. Even if the established threshold voltage for unijunction transistor Q1 is only accurate to within ±10%, the possible deviations in the time delay are not significant. With the exemplary voltage values used above, the unijunction transistor Q1 will fire when its emitter voltage is raised to 98.5±.35 volt. If, in FIGURE 4, point 27 corresponds to 98.5 volts, the 0.7 volt spread will not cause appreciable errors in the time delay. It will thus become obvious that greater accuracy is achieved as the voltage across the base terminals of the unijunction transistor Q1 is decreased.

Figure 3:
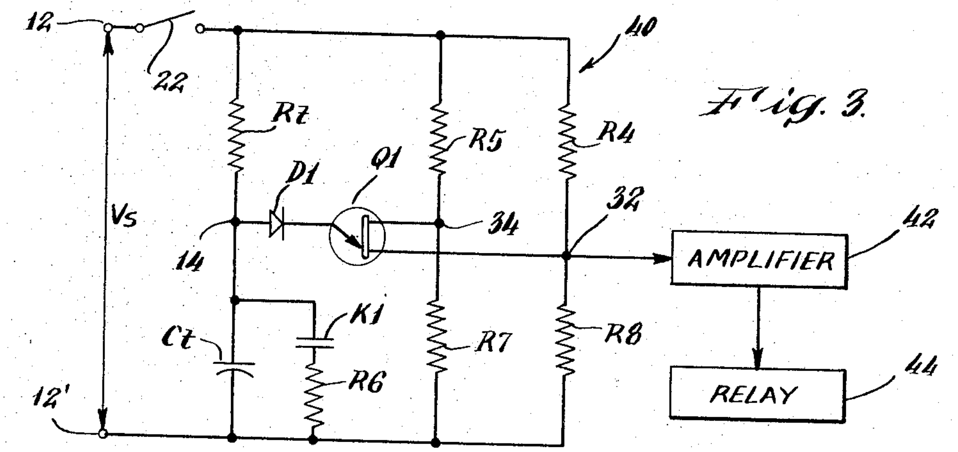
FIGURE 3 is a detailed schematic diagram of still another embodiment of my invention.

Turning to FIGURE 3, the time delay unit, generally indicated at 40, is substantially identical to the time delay unit 30 of FIGURE 2 except that a resistor R7 is substituted for the capacitor C1 and a resistor R8 is substituted for the relay coil L1. The main advantage of the time delay unit 40 over the delay unit 30 of FIGURE 2 is that the amount of zero suppression may be varied over a considerably wider range thus providing for wide range adjustment of the time delay obtainable by the unit 40. That is, the resistors R4 and R8 may be appropriately varied in resistance value so as to establish the voltage level at junction 32 at any desired zero suppression level. In the circuit of FIGURE 2, the relay coil L1 and the Zener diode D2 are limiting factors in the selection of the voltage level at junction 32. The resistance values of resistors R5 and R7 are then chosen such that the voltage level at junction 34 is somewhat above the voltage level at junction 32. In the embodiment of FIGURE 2 however, because of the inclusion of the by-pass capacitor C1, the voltage level at junction 34 could not be varied from the voltage level applied across the input terminals 12, 12′. Moreover, since the voltage levels at junctions 32 and 34 are established by purely resistive elements, the time delay unit 40 of FIGURE 3, as the unit 10 of FIGURE 1, is more truly compensated for gradual or slow variations in the supply voltage $V_s$ than the unit 30 of FIGURE 2.

As in the operating fashion of FIGURE 2, the unijunction transistor Q1 of FIGURE 3 breaks down when the voltage at its emitter reaches the required threshold voltage established by the voltage difference between junctions 34 and 32. As the capacitor $C_t$ discharges through diode D1 and the emitter-base one circuit of the unijunction transistor Q1, the resulting signal appearing at junction 32 is applied to a conventional amplifier 42. The output from the amplifier 42 operates the relay 44 which controls external circuitry to signal the termination of the time delay period and to close contacts K1 discharging capacitor $C_t$. Separate holding circuitry (not shown) may be required to hold relay 44 in once it is operated.

Referring to both FIGURES 2 and 3, it will be observed that the time delay units could function without the inclusion of the resistive elements between the base two terminal of the transistors Q1 and the positive side of the charging source $V_s$ at input terminal 12. However, it is recommended that such elements be included so as to provide some measure of temperature and current stability for the unijunction transistors.

It will thus be seen that I have provided a novel electrical time delay unit capable of providing long time delays while using low-voltage threshold devices. Although unijunction transistors are specifically disclosed in several of the embodiments, other forms of semiconductor devices having or adapted to have threshold voltage characteristics are contemplated. It will be appreciated that the relay operating coil L1 may also be connected between the base one terminal of the unijunction transistor Q1 and the junction 32 in either FIGURES 2 or 3 where only momentary relay contact closures are required to signal the expiration of the time delay. If the voltage across the base terminals of the unijunction transistor is sufficiently increased, the leakage current through the transistor may supply sufficient holding current for the relay coil. Moreover, rather than developing the time varying voltage of interest during the charging cycle of a timing capacitor as herein disclosed, it will be appreciated that the timing capacitor discharge cycle could also be used to provide the necessary timing function.

It will thus be seen that the objects set forth above, among those made apparent from the preceding description, are efficiently attained in providing a time delay unit for universal application wherever controlled time delays are desired. Since certain changes may be made in the above constructions without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. An electrical time delay unit comprising, in combination;

(A) a source connected across first and second input terminals;

(B) a resistor connected between said first input terminal and a first junction;

(C) a timing capacitor connected between said first junction and said second input terminal, said capacitor being (1) charged by said source at a predetermined rate;

(D) a first potential divider connected across said input terminals, said first potential divider having (1) a second junction;

(E) a second potential divider connected across said input terminals, said second potential divider including (1) a third junction;

(F) a unijunction transistor having (1) an emitter terminal connected to said first junction, (2) a base one terminal connected to said second junction, and (3) a base two terminal connected to said third junction, (4) said unijunction transistor operating to fire and provide an output indication signalling the expiration of a predetermined time delay when the voltage at said first junction reaches a predetermined percentage of the voltage differential between said second and third junctions, (a) the voltage at said second junction being large relative to the voltage differential between said second and third junctions.

2. The unit defined in claim 1 and (G) a relay operating to signal the expiration of said predetermined time delay, said relay having (1) an operating coil connected in circuit with said base one terminal to be energized when said unijunction transistor fires, and (2) contacts connected across said timing capacitor, said contacts closing on energization of said coil to discharge said capacitor.

3. The unit claimed in claim 2 and (H) a switch connected in series with source, said switch (1) closing to initiate said predetermined time delay.

4. An electrical time delay unit comprising, in combination:

(A) a source;

(B) a resistor;

(C) a timing capacitor connected in series with said resistor at a first junction, (1) said series connected capacitor and resistor being connected across said source, (2) said capacitor being charged from said source at a predetermined rate to provide a time varying voltage at said first junction;

(D) a second junction coupled to said source to develop a zero suppression voltage above the voltage reference of said source but less than the rated voltage of said source;

(E) a third junction coupled to said source for developing a voltage somewhat greater than said zero suppression voltage;

(F) a unijunction transistor having (1) an emitter terminal connected to said first junction, (2) a base one terminal connected to said second junction, and (3) a base two terminal connected to said third junction, (4) said unijunction transistor operating to signal the expiration of said predetermined time delay when the voltage at said first junction reaches an established relationship to the voltage difference between said second and third junctions.

5. The unit defined in claim 4 and (G) a by-pass capacitor connected to said third junction to maintain the voltage level at said third junction substantially constant.

6. The unit defined in claim 5 and (H) a relay operating to signal the expiration of said predetermined time delay, said relay including (1) an operating coil connected to said second junction to be energized by operation of said unijunction transistor, and (2) contacts closing on operation of said relay to discharge said timing capacitor, (3) the normal current through said coil being sufficient to hold said relay in its operated condition thereby maintaining said contacts closed to insure complete discharge of said timing capacitor.

7. The unit defined in claim 6 and (I) a Zener diode connected in series with said coil to insure operation of said relay on operation of said unijunction transistor.

References Cited

UNITED STATES PATENTS

| | | | |
|---|---|---|---|
| 2,583,328 | 1/1952 | Dimond | 324—68 X |
| 2,753,494 | 7/1956 | McLellan | 317—153 X |
| 3,237,023 | 2/1966 | Wilhelm | 307—88.5 |
| 3,249,771 | 3/1966 | Pearse et al. | 307—88.5 |

OTHER REFERENCES

G. E. Transistor Design Package, vol. 3, folio 1, February 1963.

MILTON O. HIRSHFIELD, *Primary Examiner.*

J. A. SILVERMAN, *Assistant Examiner.*